United States Patent [19]

Heineck

[11] Patent Number: 5,998,254
[45] Date of Patent: Dec. 7, 1999

[54] METHOD FOR CREATING A CONDUCTIVE CONNECTION BETWEEN AT LEAST TWO ZONES OF A FIRST CONDUCTIVITY TYPE

[75] Inventor: Lars-Peter Heineck, Paris, France

[73] Assignee: Siemens Aktiengesellschaft, Munich, Germany

[21] Appl. No.: 09/055,800

[22] Filed: Apr. 6, 1998

[30] Foreign Application Priority Data

Apr. 4, 1997 [DE] Germany ............................ 197 13 961

[51] Int. Cl.⁶ ...................... H01L 21/8242; H01L 21/22; H01L 21/4763
[52] U.S. Cl. ........................ 438/243; 438/246; 438/247; 438/249; 438/386; 438/389; 438/392; 438/558; 438/618
[58] Field of Search ..................... 438/530, 249, 438/618, 243, 246, 247, 386, 392, 389, 556, 564, 558, 542, 647

[56] References Cited

U.S. PATENT DOCUMENTS 5,185,294  2/1993  Lam et al. ............................... 437/193
5,545,581  8/1996  Armacost .................................. 437/52

FOREIGN PATENT DOCUMENTS

0720220A1  7/1996  European Pat. Off. .
0720221A1  7/1996  European Pat. Off. .

*Primary Examiner*—Charles Bowers
*Assistant Examiner*—Thanhha Pham
*Attorney, Agent, or Firm*—Herbert L. Lerner; Laurence A. Greenberg

[57] ABSTRACT

The method sequence results in a conductive connection between two zones of a first conductivity type. In particular, one of the zones is a source/drain zone of a transistor. Instead of the conventional additional nitride layer, the connection is produced by implanting directly into the third insulation layer, which is present anyway, and by utilizing the fact that the third insulation layer forms the lateral spacers on the gatestack disposed on the region of the second conductivity type.

13 Claims, 3 Drawing Sheets

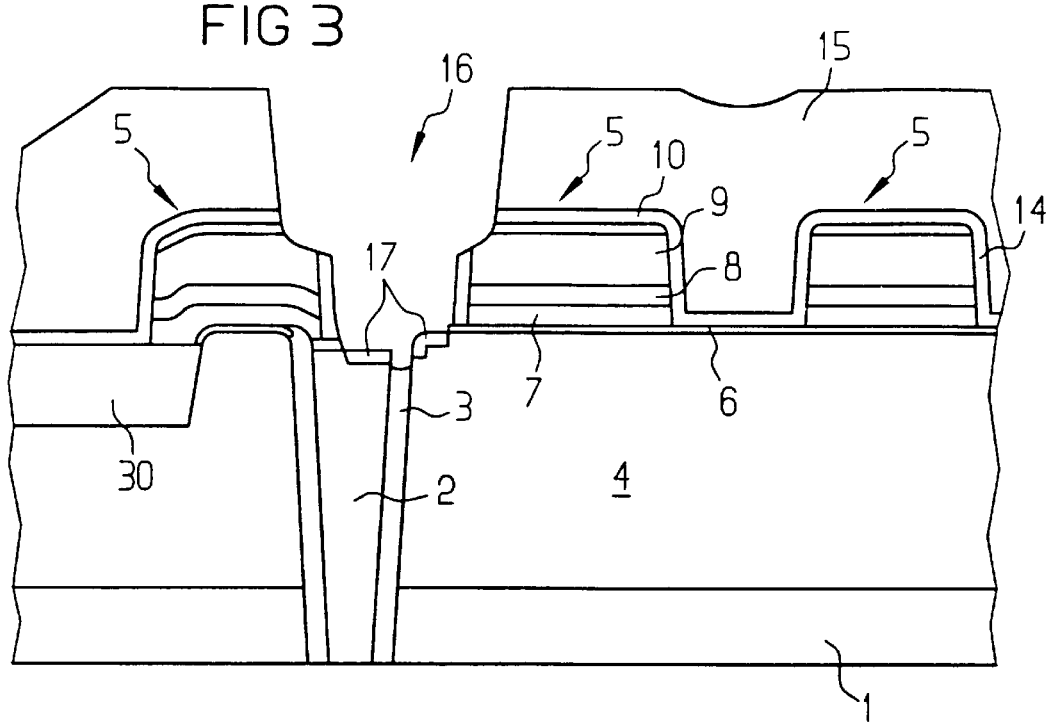
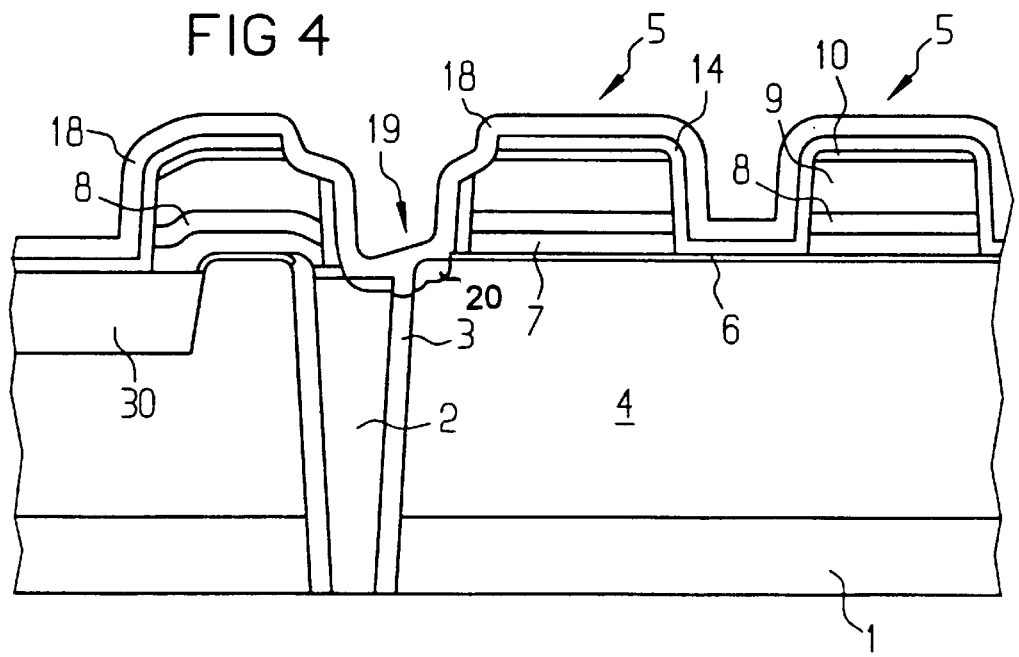

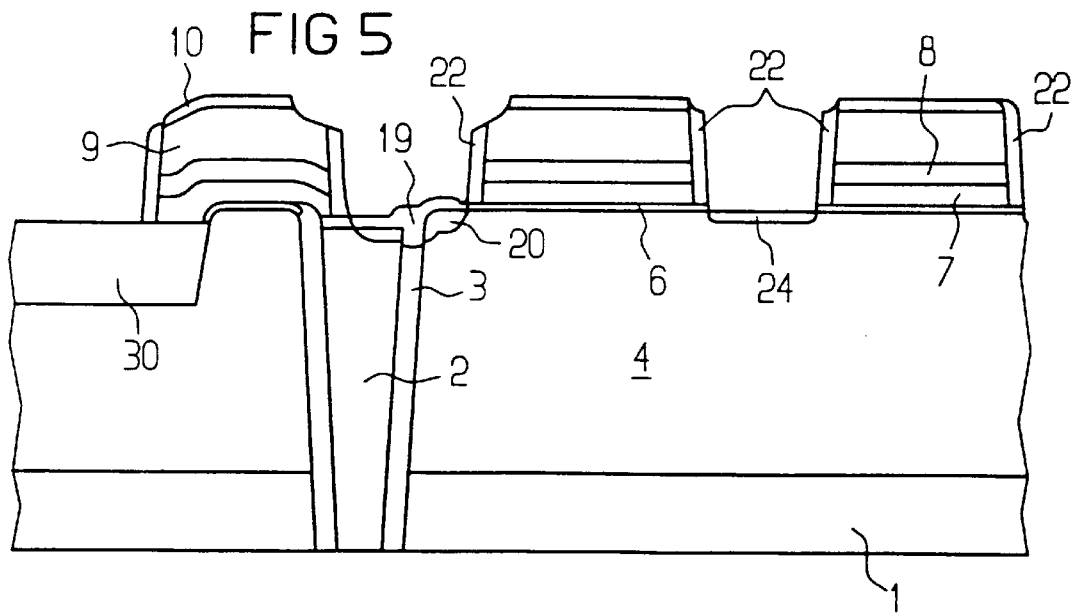
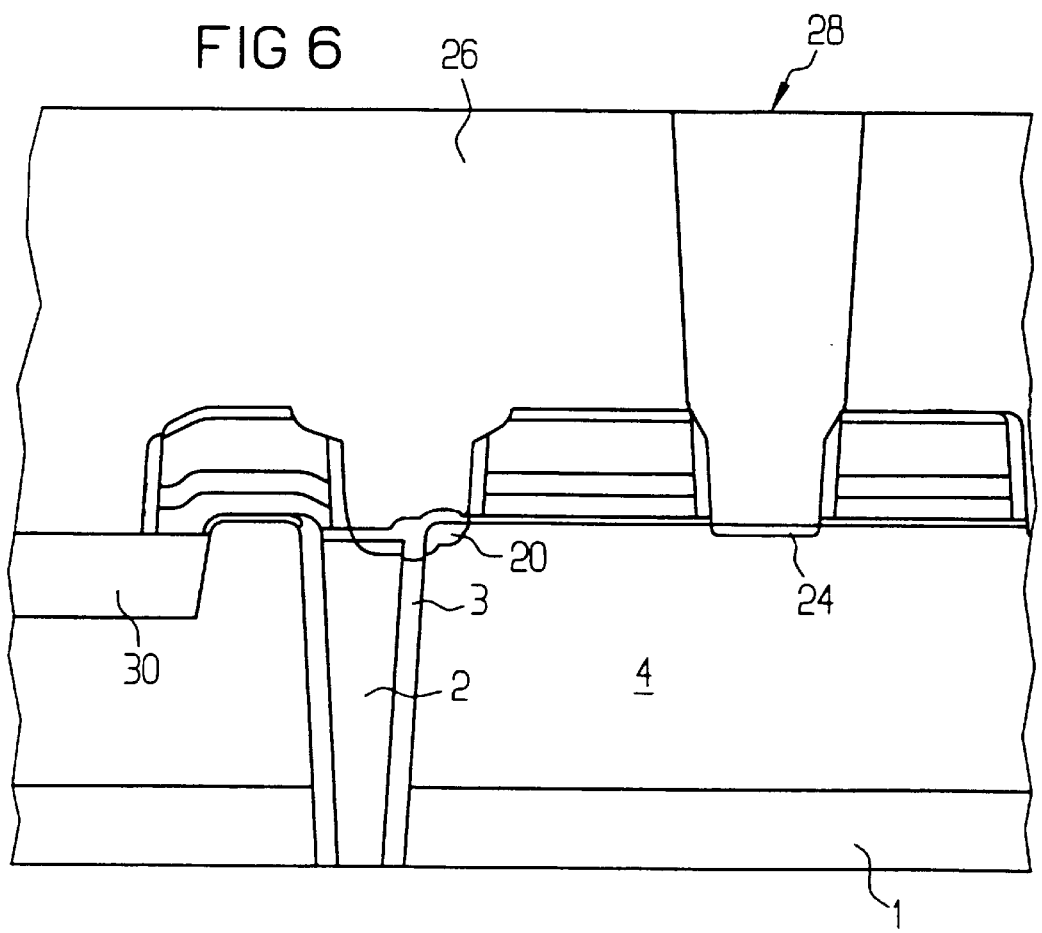

METHOD FOR CREATING A CONDUCTIVE CONNECTION BETWEEN AT LEAST TWO ZONES OF A FIRST CONDUCTIVITY TYPE

BACKGROUND OF THE INVENTION

FIELD OF THE INVENTION

The invention relates to semiconductors. More specifically, the invention relates to a method for creating a conductive connection between at least two zones of a first conductivity type, in which at least one of the zones is a source/drain zone of a transistor.

In the manufacture of integrated semiconductor products, the problem often arises that two zones of one conductivity type which are spaced apart from one another have to be connected by means of a conductive connection. Such a situation exists in the manufacture of large scale integrated memory components, for instance. Memory components comprise many memory cells, typically each having one transistor and one storage capacitor. Where the storage capacitor is a trench capacitor, which stores the charge to be stored on the inner electrode, then the inner electrode must be connected to one of the source/drain zones of the transistor in order to assure that the memory cell will be functional.

To produce such a connection, a so-called "surface strap" may be used, of the kind disclosed in U.S. Pat. No. 5,185,294. However, the production process for the surface strap, as it is described in U.S. Pat. No. 5,185,294, or a similar method, is not easily integrated into the production process for a transistor or a memory cell.

SUMMARY OF THE INVENTION

It is accordingly an object of the invention to provide a method of conductively connecting two or more zones of a first conductivity type, which overcomes the above-mentioned disadvantages of the prior art devices and methods of this general type and which furnishes a simple and economical process which is particularly applicable to where at least one of the zones is a source/drain zone of a transistor.

With the foregoing and other objects in view there is provided, in accordance with the invention, a method of conductively connecting at least two zones of a first conductivity type, where, in particular, one of the zones is a source/drain zone of a transistor. The method comprises the following steps:

a) providing a semiconductor structure with a substrate, having a first zone of a first conductivity type formed therein and having a region of a second conductivity type formed therein spaced apart from the first zone, with a stacked arrangement disposed on the region of the second conductivity type, the stacked arrangement including a first insulation layer, a conductive layer, and a second insulation layer;

b) applying a third insulation layer on the semiconductor structure;

c) forming an opening, by a phototechnique, over a part of the region of the second conductivity type and a part of the first zone of the first conductivity type;

d) introducing a dopant of the first conductivity type through the opening and into the region of the second conductivity type;

e) applying a polysilicon layer on the semiconductor structure, and a performing a temperature treatment for diffusing the dopant of the first conductivity type into the polysilicon layer and into the region of the second conductivity type and for creating a second zone of the first conductivity type in the substrate;

f) removing that part of the polysilicon layer into which no dopant of the first conductivity type has diffused;

g) removing the third insulation layer and retaining insulation regions laterally on the stacked arrangement; and h) forming a third zone of the first conductivity type by introducing a dopant of the first conductivity type into a part of the region of the second conductivity type.

The novel method has the advantage that the deposition of an additional nitride barrier layer that is normally done for a surface strap can be omitted. The function of this additional nitride barrier layer is instead performed by the third insulation layer, which is present anyway, and which in the further course of the method forms the lateral spacers on the gatestack disposed on the region of the second conductivity type. By the omission of an additional nitride barrier layer, a considerable saving of space between two gatestacks can be attained. As a consequence of this saving of space, the memory cell can be reduced further in size, and it is easier to perform depositions of a dielectric or the later etching of contact holes.

Moreover, because of the fact that the third zone of the first conductivity type is not created until after the temperature treatment for out-diffusion of the dopant into the polysilicon layer, the diffusion of dopant underneath the first insulation layer of the stacked arrangement is reduced considerably. This leads to a reduction in the electrical fields in this region and thus to a reduction in GIDL (gate induced drain leakage) and an improvement in the performance of the transistor, which can be formed of the gatestack and both the second and third zones of the first conductivity type. When the method of the invention is employed in a memory cell, the result is thus longer retention of the information in the cell ("retention performance"). Because of the reduced out-diffusion of dopant underneath the first insulation layer of the stacked arrangement, the thickness of the insulation regions on the sides of the stacked arrangement can also be reduced further, which in turn provides increased saving of space between two gatestacks. Once again, as a consequence of this saving of space, the memory cell can be reduced further in size, and it is easier to perform depositions of a dielectric or the etching of contact holes, which are done later.

In accordance with an added feature of the invention, the third insulation layer is a silicon nitride layer.

In accordance with an additional feature of the invention, a second conductive layer is formed on the first above-mentioned conductive layer. In a preferred mode, the first conductive layer is a doped polysilicon layer, and the second conductive layer is a tungsten silicide layer.

In accordance with another feature of the invention, a thin oxide layer is applied prior to step b).

Also prior to step b), a dopant of the first conductivity type may be introduced into at least a part of the region of the second conductivity type. This doping can be utilized to embody a so-called LDD transistor structure.

In accordance with a further feature of the invention, the dopant of the first conductivity type is introduced by implanting the dopant.

In accordance with again a further feature of the invention, the above-mentioned removing step comprises removing that part of the polysilicon layer into which no dopant of the first conductivity type has diffused by selective wet etching with KOH lye.

In accordance with again another feature of the invention, those parts of the polysilicon layer which remain are oxidized.

In accordance with a concomitant feature of the invention, boron is selected as the dopant of the first conductivity type.

Other features which are considered as characteristic for the invention are set forth in the appended claims.

Although the invention is illustrated and described herein as embodied in a method for creating a conductive connection between at least two zones of a first conductivity type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–6 are partial, elevational, schematic views illustrating the process sequence of the novel method.

DESCRIPTION OF THE PREFERRED EMBODIMENTS

Figure 1:
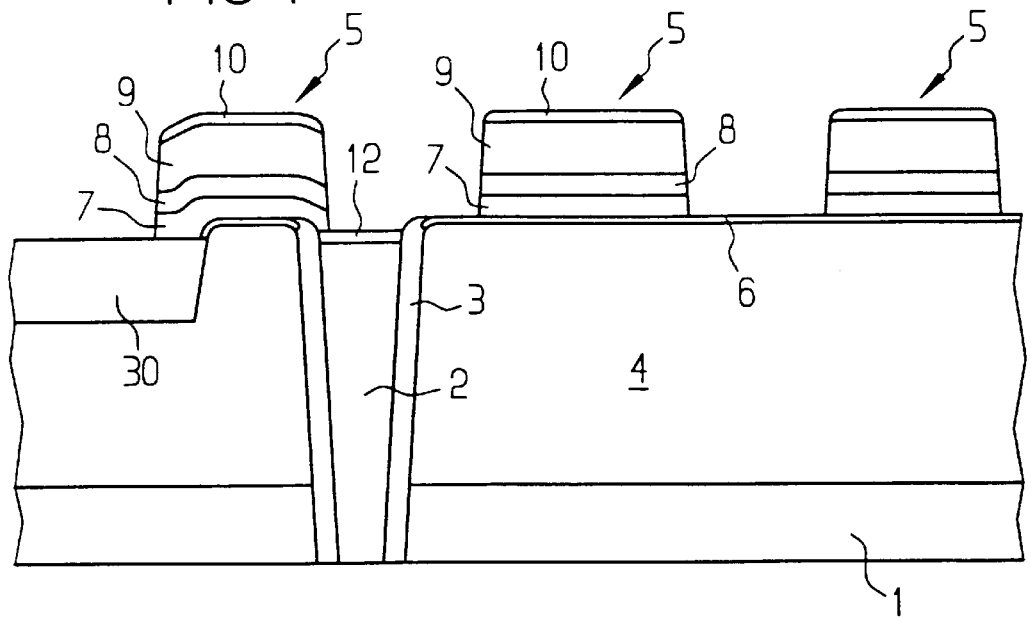

Referring now to the figures of the drawing in detail and first, particularly, to FIG. 1 thereof, there is seen a first semiconductor substrate 1 with a first zone 2 of a first conductivity type. In the exemplary embodiment, the zone 2 is an upper, p-doped polysilicon filling of a trench capacitor. The zone 2 is separated from the substrate 1 by a silicon dioxide layer 3—a so-called collar—and by a non-illustrated oxide-nitride-oxide layer. A region 4 of a second conductivity type is also disposed in the substrate 1. In the example, the region 4 is an N-well for P-channel transistors to be formed later. A trench insulation 30 is provided in the N-well 4.

A stacked arrangement 5 is disposed above the N-well 4 is. This stacked arrangement 5 includes an insulation layer 6 (gate oxide), a conductive layer 7 (gate), which in this case is a highly doped polysilicon layer 7, a tungsten silicide layer 8, and a second insulation layer 9. The insulation layer 9 is formed of silicon nitride. A silicon oxide layer 10 is disposed as a further insulation layer over the insulation layer 9.

A non-illustrated thin oxide spacer is provided on sides of the stacked arrangement 5. The oxide spacer assures a certain spacing between the stacked arrangement 5 and a non-illustrated LDD-boron implantation in the N-well 4.

A silicon oxide layer 12 that has been produced by a TEOS process is located on the surface of the polysilicon filling 2.

Figure 2:
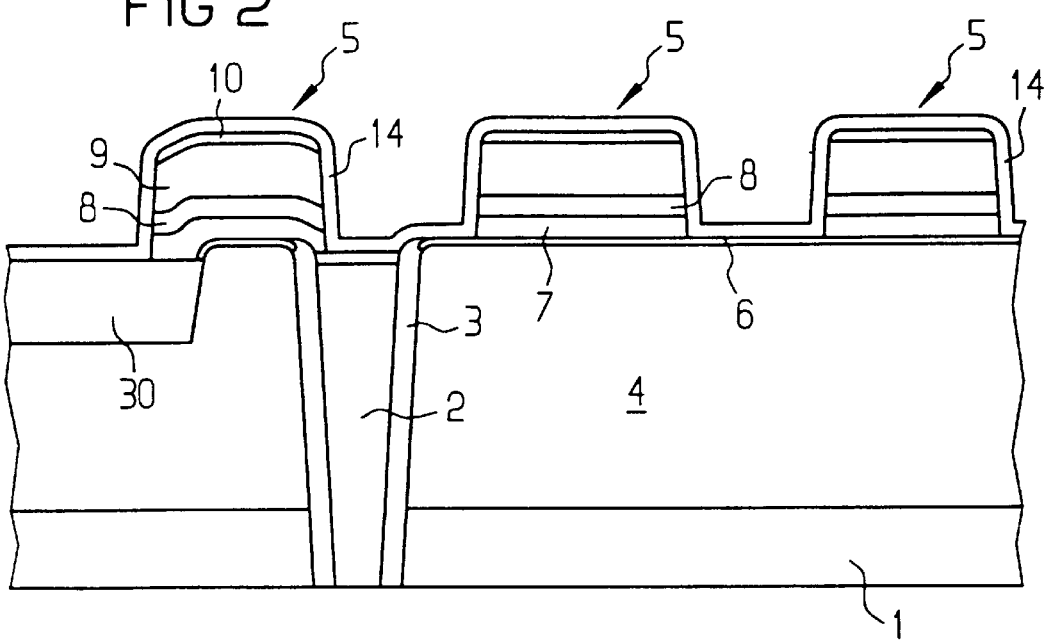

A third insulation layer 14 is subsequently applied onto the semiconductor structure shown in FIG. 1. The third insulation layer 14 is preferably a silicon nitride layer that is created by means of an LPCVD process. The resultant structure is shown in FIG. 2.

In a next step, a photoresist 15 is applied and structured using a mask technique. The photoresist 15 is structured in the process such that an ensuing etching creates an opening 16, thus laying bare part of the N-well 4 and part of the polysilicon filling 2. Through the opening, a p-dopant implantation (boron) is subsequently effected. The dopant 17 is thus concentrated at the surface of the N-well and the surface of the polysilicon filling 2. The resultant structure is shown in FIG. 3.

Next, a polysilicon layer 18 is deposited over the full surface by an LPCVD process, and a temperature treatment is performed. In this temperature treatment, the semiconductor structure is heated for approximately 1 hour to approximately 875° C. As a result of the temperature treatment, some of the dopant atoms 17, which are first concentrated at the surface of the N-well 4 and the surface of the polysilicon filling 2, diffuse into the polysilicon layer 18. This creates a doped portion 19 of the polysilicon layer 18. In addition, some of the dopant atoms 17 concentrated at the surface of the N-well 4 diffuse farther into the N-well 4, thus creating a second zone 20 of the first conductivity type. The resultant structure is shown in FIG. 4.

Next, the part of the silicon layer 18 into which no dopant atoms have diffused is removed. This is done for instance by wet chemical etching using a KOH lye. After that etching treatment, only the doped portion 19 of the polysilicon layer 18 remains. The portion 19 now joins to one another the first and second zones of the first conductivity type (zones 2 and 20). Subsequently, the doped portion 19 of the polysilicon layer 18 is oxidized (at approximately 825° C. for approximately 1 hour), and the insulation layer 14 is etched anisotropically, so that only insulation regions 22 remain behind at the sides of the stacked arrangement 5. After the anisotropic etching of the third insulation layer 14, a dopant of the first conductivity type (boron) is again implanted, thus creating a third zone 24 of the first conductivity type. The zones 20 and 24 can be used as source/drain zones of a field effect transistor. The resultant structure is shown in FIG. 5.

Onto the structure of FIG. 5, a PSG or BPSG layer 26 is subsequently deposited and planarized by means of CMP (chemical mechanical polishing). A contact hole is then etched into the layer 26 by means of a photographic technique (FIG. 6).

As can be seen from the description of the exemplary embodiment of the invention, the novel method has the advantage that the deposition of an additional nitride barrier layer that is normally required for a surface strap 19 can be omitted. The function of the additional nitride barrier layer is instead performed by the third insulation layer 14, which is present anyway, and which in the further course of the method forms the lateral insulation regions "spacers" 22 on the stacked arrangement 5 ("gatestack") on the region 4 of the second conductivity type. By the omission of an additional nitride barrier layer, a considerable saving of space between two stacked arrangements 5 ("gatestacks") can be attained. As a consequence of this saving of space, the memory cell can be reduced further in size, and it is easier to perform depositions of a dielectric 26 or the etching of contact holes 28, which are done later.

Moreover, due to the fact that the third zone 24 of the first conductivity type is not created until after the temperature treatment for out-diffusion of the dopant 17 into the polysilicon layer 18, the diffusion of dopant underneath the first insulation layer 6 of the stacked arrangement 5 is reduced considerably. This leads to a reduction in the electrical fields in this region and thus to a reduction in GIDL (gate induced drain leakage) and an improvement in the performance of the transistor, which can be formed of the stacked arrangement 5 and both the second and third zones 20, 24 of the first conductivity type. When the method of the invention is employed in the manufacture of a memory cell, the result is thus longer retention of the information in the cell ("retention performance"). Because of the reduced out-diffusion of dopant underneath the first insulation layer 6 of the stacked arrangement 5, the thickness of the insulation regions 22 on the sides of the stacked arrangement can also be reduced further, which in turn provides increased saving of space between two stacked arrangements 5 (gatestacks). Once again, as a consequence of this saving of space, the memory cell can be reduced further in size, and it is subsequently easier to deposit the dielectric 26 or to etch the contact holes 28.

I claim:

1. A method of conductively connecting at least two zones of a first conductivity type, the method which comprises the following steps:

a) providing a semiconductor structure with a substrate, having a first zone of a first conductivity type formed therein and having a region of a second conductivity type formed therein spaced apart from the first zone, with a stacked arrangement disposed on the region of the second conductivity type, the stacked arrangement including a first insulation layer, a conductive layer, and a second insulation layer;

b) applying a third insulation layer on the semiconductor structure;

c) forming an opening, by a phototechnique, over a part of the region of the second conductivity type and a part of the first zone of the first conductivity type;

d) introducing a dopant of the first conductivity type through the opening and into the region of the second conductivity type;

e) applying a polysilicon layer on the semiconductor structure, and a performing a temperature treatment for diffusing the dopant of the first conductivity type into the polysilicon layer and into the region of the second conductivity type and for creating a second zone of the first conductivity type in the substrate;

f) removing that part of the polysilicon layer into which no dopant of the first conductivity type has diffused;

g) removing the third insulation layer and retaining insulation regions laterally on the stacked arrangement; and h) forming a third zone of the first conductivity type by introducing a dopant of the first conductivity type into a part of the region of the second conductivity type.

2. The method according to claim 1, wherein the third insulation layer is a silicon nitride layer.

3. The method according to claim 1, which further comprises forming a second conductive layer on the first above-mentioned conductive layer.

4. The method according to claim 3, wherein the first above-mentioned conductive layer is a doped polysilicon layer, and the second conductive layer is a tungsten silicide layer.

5. The method according to claim 1, which comprises, prior to step b), applying a thin oxide layer.

6. The method according to claim 1, which comprises, prior to step b), introducing a dopant of the first conductivity type into at least a part of the region of the second conductivity type.

7. The method according to claim 6, wherein the steps of introducing the dopant of the first conductivity type comprises implanting the dopant.

8. The method according to claim 1, wherein the step of introducing the dopant of the first conductivity type comprises implanting the dopant.

9. The method according to claim 1, wherein the removing step comprises removing that part of the polysilicon layer into which no dopant of the first conductivity type has diffused by selective wet etching with KOH lye.

10. The method according to claim 9, which comprises, after the removing step, oxidizing a remaining part of the polysilicon layer.

11. The method according to claim 1, which comprises, after the removing step, oxidizing a remaining part of the polysilicon layer.

12. The method according to claim 1, which comprises selecting boron as the dopant of the first conductivity type.

13. The method according to claim 1, wherein the step of creating the second zone comprises creating a source/drain zone of a transistor.

\* \* \* \* \*